United States Patent
Tomai et al.

(10) Patent No.: US 9,243,318 B2
(45) Date of Patent: Jan. 26, 2016

(54) SINTERED MATERIAL, AND PROCESS FOR PRODUCING SAME

(75) Inventors: Shigekazu Tomai, Sodegaura (JP); Shigeo Matsuzaki, Sodegaura (JP); Koki Yano, Sodegaura (JP); Makoto Ando, Sodegaura (JP); Kazuaki Ebata, Sodegaura (JP); Masayuki Itose, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 129 days.

(21) Appl. No.: 14/006,851

(22) PCT Filed: Mar. 26, 2012

(86) PCT No.: PCT/JP2012/002061
§ 371 (c)(1), (2), (4) Date: Sep. 23, 2013

(87) PCT Pub. No.: WO2012/127883
PCT Pub. Date: Sep. 27, 2012

(65) Prior Publication Data
US 2014/0014500 A1    Jan. 16, 2014

(30) Foreign Application Priority Data
Mar. 24, 2011    (JP) .................................. 2011-065291

(51) Int. Cl.
*C04B 35/00* (2006.01)
*C23C 14/34* (2006.01)
(Continued)

(52) U.S. Cl.
CPC ............. *C23C 14/3414* (2013.01); *C04B 35/01* (2013.01); *H01L 21/02565* (2013.01); *H01L 21/02631* (2013.01); *C04B 2235/3217* (2013.01); *C04B 2235/3286* (2013.01); *C04B 2235/3293* (2013.01); *C04B 2235/6562* (2013.01); *C04B 2235/6567* (2013.01); *C04B 2235/6584* (2013.01); *C04B 2235/76* (2013.01); *C04B2235/77* (2013.01); *C04B 2235/95* (2013.01); *C04B 2235/96* (2013.01)

(58) Field of Classification Search
CPC .................. H01J 37/3426; H01L 2224/75186; C23C 14/34; C22C 28/00
USPC ...................................... 204/298.13; 501/126
See application file for complete search history.

(56) References Cited

U.S. PATENT DOCUMENTS

| | | | |
|---|---|---|---|
| 8,148,245 B2* | 4/2012 | Ikisawa et al. | 438/482 |
| 2008/0274351 A1* | 11/2008 | Itoh et al. | 428/337 |
| 2009/0045051 A1* | 2/2009 | Ferrasse et al. | 204/298.13 |

(Continued)

FOREIGN PATENT DOCUMENTS

| | | |
|---|---|---|
| JP | 11-256320 A | 9/1999 |
| JP | 2003-183820 A | 7/2003 |

(Continued)

OTHER PUBLICATIONS

International Search Report for Application No. PCT/JP2012/002061 dated Jun. 19, 2012.

(Continued)

*Primary Examiner* — Noah Wiese
(74) *Attorney, Agent, or Firm* — Foley & Lardner LLP

(57) ABSTRACT

A sintered body which includes at least indium oxide and gallium oxide and comprises voids each having a volume of 14000 μm$^3$ or more in an amount of 0.03 vol % or less.

6 Claims, 4 Drawing Sheets

(51) Int. Cl.
*C04B 35/01* (2006.01)
*H01L 21/02* (2006.01)

(56) References Cited

U.S. PATENT DOCUMENTS

| | | |
|---|---|---|
| 2011/0111135 A1 | 5/2011 | Kamiyama et al. |
| 2011/0168994 A1* | 7/2011 | Kawashima et al. ........... 257/43 |
| 2011/0180763 A1 | 7/2011 | Utsuno et al. |
| 2011/0240935 A1* | 10/2011 | Yano et al. ............... 252/519.51 |
| 2012/0093712 A1* | 4/2012 | Yano et al. ............... 423/594.14 |
| 2012/0184066 A1* | 7/2012 | Yano et al. .................... 438/104 |

FOREIGN PATENT DOCUMENTS

| | | | |
|---|---|---|---|
| JP | 2006-241595 A | 9/2006 | |
| JP | 2010-202450 A | 9/2010 | |
| JP | 2010-238770 A | 10/2010 | |
| WO | WO-2007/077781 A1 | 7/2007 | |
| WO | WO-2009/084537 A1 | 7/2009 | |
| WO | WO/2009/148154 | * 12/2009 | .............. C23C 14/34 |
| WO | WO-2009/148154 A1 | 12/2009 | |
| WO | WO-2010/004734 A1 | 1/2010 | |
| WO | WO-2010/032422 A1 | 3/2010 | |
| WO | WO-2010/070832 A1 | 6/2010 | |

OTHER PUBLICATIONS

Translation of Written Opinion of the International Searching Authority for International Application No. PCT/JP2012/002061 dated Sep. 24, 2013.

* cited by examiner

CT image

Cross-sectional image of a void portion

Extracted image of a void

CT image

Cross-sectional image of a void portion

Extracted image of a void

SINTERED MATERIAL, AND PROCESS FOR PRODUCING SAME

TECHNICAL FIELD

The invention relates to a sintered body, a production method thereof, a sputtering target and a method for producing an oxide thin film using this sputtering target.

BACKGROUND ART

In order to realize a large-area and highly-precise next-generation display, a transistor having a high mobility is required. For use in a transistor, an oxide semiconductor has attracted attention. As a candidate material of an oxide semiconductor, a thin film of amorphous indium gallium zinc oxide (IGZO) is promising. This thin film can be obtained by sputtering a target formed of a sintered body having the same composition.

In a sputtering method, generally, glow discharge is allowed to occur between a substrate as the anode and a target as the cathode in an argon gas pressure of about 10 Pa or less, thereby to generate argon plasma. Argon positive ions in this plasma collide with the target as the cathode to cause the particles of the target components to fly off, and these particles are then deposited on the substrate to form a film.

A sputtering method is divided into several methods according to the manner of argon plasma generation. A method which uses high-frequency plasma is called high-frequency sputtering method, and a method which uses direct current plasma is called direct current sputtering method. Further, a method in which magnets are arranged on the rear side of the target to allow argon plasma to concentrate on just above the target, whereby collision efficiency of argon ions is increased to enable film formation at a low pressure is called "magnetron sputtering method".

An IGZO sintered body is generally used as an oxide semiconductor target. An IGZO sintered body is produced by a powder sintering method in which, substantially, an indium oxide, a gallium oxide and a zinc oxide are compounded to have a desired composition, and the resulting mixture is subjected to press shaping, and the shaped body is then sintered at a temperature of 1400° C. or higher (Patent Document 1).

Further, in order to improve transistor performance, development of a sintered body for obtaining a crystalline oxide semiconductor such as indium oxide gallium (IGO) has been studied (Patent Document 2). As for the method for sintering an IGO target, by conducting sintering at 1200° C. to 1600° C. for 2 hours or more, gallium is solid dissolved in an indium site, whereby a high-density target can be obtained.

However, it has been found that if sputtering is conducted at a large power of 3 W/cm² or more by using a middle- to large-sized target in which a longer side or one side has a length exceeding 5 inches (i.e. a target having an area exceeding 25000 mm²) that is produced under these conditions, particles may generate.

Also, it has been confirmed that such a phenomenon hardly occurs in a small-sized target having a size of 4 inches or less. An oxide semiconductor is originally a material that meets requirements for an increase in area of a display. Of these oxide semiconductors, a material comprising both indium and gallium such as IGO has a problem that particles may generate. Therefore, there is a demand for solving this problem.

RELATED ART DOCUMENTS

Patent Documents

Patent Document 1: JP-A-2010-238770
Patent Document 2: WO2010-032422

SUMMARY OF THE INVENTION

In view of the above-mentioned problems associated with conventional technologies, an object of the invention is to obtain a sputtering target which does not suffer from generation of particles even if sputtering is conducted at high power and is capable of obtaining a long-running high-quality oxide semiconductor thin film.

As a result of intensive studies, the inventors have found that a sintered body having a small void ratio can suppress occurrence of particle generation.

According to the invention, the following sintered body or the like can be provided.

1. A sintered body which comprises at least indium oxide and gallium oxide and comprises voids each having a volume of 14000 μm³ or more in an amount of 0.03 vol % or less.
2. A method for producing the sintered body according to 1, wherein one surface of the sintered body has an area of 25000 mm² or more and a thickness of 5 mm or more.
3. The sintered body according to 1 or 2, which has an atomic ratio represented by Ga/(In+Ga) of 0.01 to 0.13 and comprises a bixbyite structure represented by $In_2O_3$.
4. The sintered body according to any of 1 to 3, which comprises tin in an amount of 100 to 10000 ppm.
5. The sintered body according to any of 1 to 4, which comprises Al in an amount of 100 to 10000 ppm.
6. A method for producing a sintered body comprising:
    a mixing step in which at least an indium-containing compound and a gallium-containing compound are mixed to obtain a mixture;
    a shaping step in which the mixture is shaped to obtain a shaped body; and
    a sintering step in which the shaped body is sintered to obtain a sintered body; wherein the sintering step comprises a heating step in which the shaped body is heated in an oxygen-containing atmosphere at an average heating rate of 0.1 to 0.9° C./min at a temperature of 700 to 1400° C. and a retaining step in which the shaped body is retained at 1250 to 1650° C. for 5 to 30 hours.
7. The method for producing a sintered body according to 6, wherein the heating is conducted by the following heating pattern:
    average heating rate at a temperature of 400° C. or more and less than 700° C. (first average heating rate): 0.2 to 1.5° C./min
    average heating rate at a temperature of 700° C. or more and less than 1100° C. (second average heating rate): 0.15 to 0.8° C./min
    average heating rate at a temperature of 1100° C. or more and less than 1400° C. (third average heating rate): 0.1 to 0.5° C./min
    the first average heating rate>the second average heating rate>the third average heating rate.
8. The method for producing a sintered body according to 6 or 7, wherein, in the heating step, the average heating rate is 0.3 to 0.5° C./min at 700° C. or more and less than 1100° C.
9. The method for producing a sintered body according to any of 6 to 8, wherein, in the heating step, the average heating rate is 0.15 to 0.4° C./min at 1100° C. or more and 1400° C. or less.

10. The method for producing a sintered body according to any of 6 to 9, wherein the atomic ratio of the mixture represented by Ga/(In+Ga) is 0.01 to 0.13 and the sintered body comprises a bixbiyte structure represented by $In_2O_3$.
11. The method for producing a sintered body according to any of 6 to 10, wherein the mixture comprises tin in an amount of 100 to 10000 ppm.
12. The method for producing a sintered body according to any of 6 to 11, wherein the mixture comprises Al in an amount of 100 to 10000 ppm.
13. The method for producing a sintered body according to any of 6 to 12, wherein one surface of the sintered body has an area of 25000 $mm^2$ or more and a thickness of 5 mm or more.
14. A sintered body produced by the method for producing a sintered body according to any of 6 to 13.
15. A sputtering target using the sintered body according to any of 1 to 5 and 14.
16. A method for producing an oxide thin film, wherein a film is formed using the sputtering target according to 15 by a sputtering method at a sputtering power of 3 to 20 $W/cm^2$.

According to the invention, it is possible to provide a sputtering target capable of producing a long-running high-quality oxide semiconductor thin film without suffering generation of particles by sputtering at a high power.

By using such a target, it becomes possible to obtain a semiconductor for a display device represented by a large-sized liquid crystal display or a large-sized EL display or a transparent electrode material for a large-area solar battery efficiently at a high yield.

MODE FOR CARRYING OUT THE INVENTION

Figure 1:
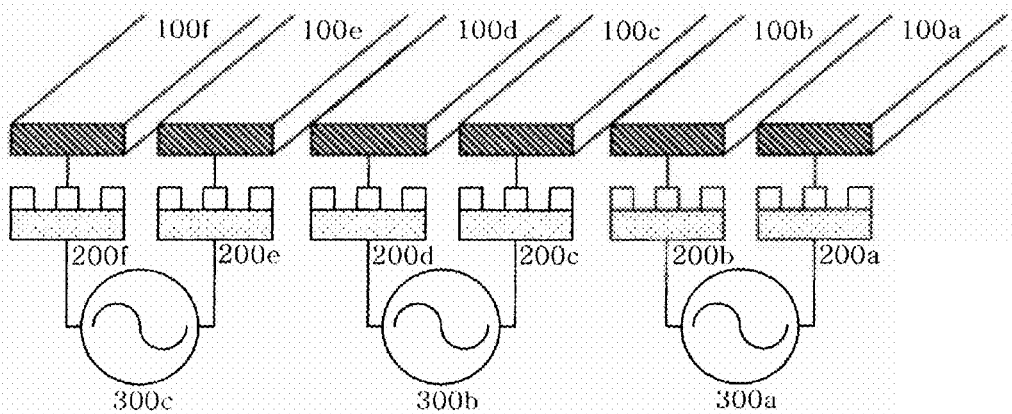
FIG. 1 is a view showing one example of a sputtering apparatus used in the method for producing an oxide thin film of the invention.

The method for producing a sintered body of the invention comprises a raw material mixing step in which at least indium oxide and gallium oxide are mixed to obtain a mixture, a shaping step in which the mixture is shaped to obtain a shaped body and a sintering step in which the shaped body is sintered in an oxygen-containing atmosphere.

The sintering step comprises a heating step and a retaining step. In the heating step, the average heating rate at 700 to 1400° C. is 0.1 to 0.9° C./min (preferably 0.2 to 0.5° C./min). In the retaining step, the sintered body is retained at 1250 to 1650° C. for 5 to 30 hours.

It is preferred that the heating rate at 700 to 1400° C. in the heating step be 0.1 to 0.9° C./min.

From the results of an X-ray CT measurement, it has been found that the generation of particles when a middle- to large-sized target is used is not attributed to the density of the target, but to the presence of fine voids inside of the target.

In a middle- to large-sized target, these fine voids, which cause generation of particles, are voids each having a volume of 14000 $\mu m^3$ or more (about 30 µm or more in terms of a diameter of an equivalent sphere obtained from the volume). By allowing the ratio of the volume of a void (hereinbelow, referred to as the "void ratio") which has a larger size than this in the sintered body (target) to be 0.03% or less, generation of particles by sputtering can be suppressed.

It is assumed that the reason that voids each having a volume of 14000 $\mu m^3$ or more are generated inside of the sintered body is that a gap is formed in the grain boundary of a bixbyite crystal during the heating step of a shaped body. In general, in the case of indium tin oxide (ITO) or the like, since tin which has not completely been solid-dissolved in an indium site is segregated in the grain boundary, a void having a volume of 14000 $\mu m^3$ or more is hardly formed. However, in the case of other materials than tin, a void tends to be formed easily. It is assumed that, if the volume of the gap becomes 14000 $\mu m^3$ or more, when sputtering is conducted for a long period of time, particles are tend to be generated on the formed film with a convex and concave pattern being a starting point.

According to the above-mentioned production method of the invention, it is possible to suppress generation of a void having a volume of 14000 $\mu m^3$ or more in the sintered body, whereby generation of particles during sputtering can be suppressed.

The average heating rate at a temperature of 700 to 1400° C. is obtained by dividing a difference in temperature between 700° C. and the attainment temperature of heating by the time required for heating.

In the heating step, it is preferred that average heating rate at a temperature of 400° C. or more and less than 700° C. (first average heating rate) be 0.2 to 1.5° C./min. The heating rate is preferably within the range of 0.2 to 2.0° C./min.

It is preferred that the average heating rate at 700 to 1400° C. be the following heating pattern.

average heating rate at a temperature of 700° C. or more and less than 1100° C. (second average heating rate): 0.15 to 0.8° C./min average heating rate at a temperature of 1100° C. or more and less than 1400° C. (third average heating rate): 0.1 to 0.5° C./min The second average heating rate is more preferably 0.3 to 0.5° C./min.

The third average heating rate is more preferably 0.15 to 0.4° C./min.

As for the average heating rate mentioned above, it is preferred that the second average heating rate be larger than (>) the third average heating rate. It is more preferred that the first average heating rate be larger than (>) the second average heating rate, and the second average heating rate be larger than (>) the third average heating rate.

It is preferred that the heating rate at a temperature range of 700° C. or more and less than 1100° C. be within the range of 0.05 to 1.2° C./min.

It is preferred that the heating rate at a temperature range of 1100° C. or more and less than 1400° C. be within the range of 0.08 to 1.0° C./min.

By allowing the heating step to be conducted in the above-mentioned heating pattern, generation of particles during sputtering can be more preferably suppressed.

If the first average heating rate is below 0.2° C./min, the time required for heating may be increased, leading to lowering in production efficiency. If the first average heating rate exceeds 1.5° C./min, a binder which has been incorporated in order to increase dispersibility during mixing may remain, leading to occurrence of cracks or the like in the target.

If the second average heating rate is below 0.15° C./min, not only the time required for heating may be increased, but also crystals may be grown extraordinary, and as a result, a void having a diameter of 50 μm or more may be generated inside of the resulting sintered body. If the second average heating rate exceeds 0.8° C./min, since sintering started at different locations, warpage may occur.

If the third average heating rate is below 0.1° C./min, not only the time required for heating may be increased, but also Ga may be evaporated to cause composition deviation. If the third average heating rate is above 0.5° C./min, according to the distribution of densification, tensile stress may be generated, whereby the sintering density may not be increased.

If the second average heating rate is larger than (>) the third average heating rate, it is expected that generation of particles can be suppressed further effectively even if sputtering is conducted for a long period of time.

Although no specific restrictions are imposed on the heating rate when the shaped body is heated to a temperature exceeding 1400° C. and 1650° C. or less, the heating rate is normally about 0.15 to 0.4° C./min.

After heating is completed, the shaped body is retained at a sintering temperature of 1250 to 1650° C. for 5 to 30 hours to conduct sintering (retaining step). The sintering temperature is preferably 1300 to 1600° C. The sintering time is preferably about 10 to 20 hours.

Sintering is conducted in an oxygen-containing atmosphere, e.g. in the oxygen atmosphere, or in the atmospheric air. Further, sintering may be conducted after substituting the atmosphere with oxygen in advance, or may be conducted while introducing air or oxygen. The oxygen-containing atmosphere preferably contains 20 vol % or more of oxygen, more preferably 50 vol % or more of oxygen.

In the raw material mixing step, as the raw materials of a sintered body, at least an indium-containing compound (indium oxide or the like) and a gallium-containing compound (gallium oxide or the like) are mixed. As the raw material, a tin-containing compound (tin oxide or the like) and an aluminum-containing compound (alumina or the like) may further be added.

An atomic ratio represented by Ga/(In+Ga) is preferably 0.01 to 0.13, more preferably 0.01 to 0.09, with 0.02 to 0.08 being further preferable.

If tin is contained in the raw material, the concentration of tin (atomic ratio) is normally 100 to 10000 ppm, preferably 200 to 2000 ppm.

When Al is contained in the raw material, the concentration of Al (atomic ratio) is normally 100 to 10000 ppm, preferably 200 to 5000 ppm.

By pressing the above-mentioned mixture, a shaped body can be produced.

The sintered body of the invention can be obtained by the above-mentioned production method.

The sintered body of the invention is a sintered body which comprises at least indium oxide and gallium oxide and comprises voids each having a volume of 14000 μm$^3$ in an amount of 0.03 vol % or less. This sintered body can be obtained by the production method of the invention.

The sintered body of the invention comprises at least indium oxide and gallium oxide. The sintered body of the invention may also comprise tin and/or aluminum.

The sintered body has an atomic ratio represented by Ga/(In+Ga) of 0.01 to 0.13, preferably 0.01 to 0.09, and more preferably 0.02 to 0.08.

It is preferred that it comprise a bixbyite structure represented by $In_2O_3$. The bixbyite structure can be confirmed by an XRD measurement.

If the sintered body comprises tin, the concentration of tin is normally 100 to 10000 ppm, preferably 200 to 2000 ppm.

If the sintered body comprises Al, the concentration of Al is normally 100 to 10000 ppm, preferably 200 to 5000 ppm.

The sintered body of the invention is substantially an oxide of indium and gallium or an oxide of indium, gallium and tin and/or aluminum, preferably. In the invention, the "substantially" means that other impurities which are inevitably mixed in may be contained within an amount range which does not impair the advantageous effects of the invention.

The area of the main surface of the sintered body of the invention is preferably 25000 mm$^2$ or more, more preferably 30000 to 1000000 mm$^2$ and further preferably 40000 to 800000 mm$^2$. The thickness of the main surface is preferably 5 mm or more, and more preferably 5 to 20 mm.

By processing and shaping of the above-mentioned sintered body and bonding the resulting shaped body to a backing plate, the sputtering target of the invention can be obtained.

The oxide thin film of the invention is formed by using the above-mentioned sputtering target and by conducting sputtering at a power of 3 to 20 W/cm$^2$, preferably 4 to 20 W/cm$^2$.

In one embodiment of the method for producing an oxide thin film of the invention, substrates are sequentially conveyed to positions opposing to three or more targets which are provided in a vacuum chamber in parallel with a prescribed interval being provided, and a negative potential and a positive potential are alternatively applied to each of the targets from an AC power source, whereby plasma is generated on the target and a film is formed on the surface of the substrate.

At this time, at least one output from the AC power source is connected to two or more targets, and between these two or more targets being connected, film formation is conducted while switching the target to which a potential is applied. That is, at least one output from the AC power source is connected to two or more targets, and film formation is conducted while applying different potentials to adjacent targets.

As the apparatus which can be used in this sputtering, an AC (alternate current) sputtering apparatus for producing a large-area display which is disclosed in JP-A-2005-290550 can be given, for example. By using this apparatus, further high-speed film-formation becomes possible, and the carrier concentration of the film can be a prescribed value with a high degree of reproducibility.

Specifically, the above-mentioned AC sputtering apparatus comprises a vacuum chamber, a substrate holder arranged within the vacuum chamber and a sputtering source arranged at a position opposing to the substrate holder. The essential parts of the sputtering source are shown in FIG. 1.

The sputtering source has a plurality of sputtering parts which respectively have a plate-like target 100a to 100f. If the surface to be sputtered of each target 100a to 100f is referred to as a sputtering surface, the sputtering parts are arranged such that the sputtering surfaces are located on the same plane.

Each of the targets 100a to 100f is formed in a narrow, rectangular shape having a longitudinal direction. These targets are of the same shape, and the edge portions (side surfaces) in the longitudinal direction of the sputtering surface are arranged in parallel with a prescribed space being provided between adjacent edge portions. Accordingly, the side surfaces of adjacent targets 100a to 100f are arranged in parallel.

Outside the vacuum chamber, AC power sources 300a to 300c are arranged. Of the two terminals of each AC power source 300a to 300c, one terminal is connected to one of the adjacent two electrodes and the other terminal is connected to the other electrode. The two terminals of each power source 300a to 300c output voltages having different polarities (positive and negative). Since the targets 100a to 100f are attached to the electrodes in a closely contact manner, alternate voltages having different polarities are applied to the targets 100a to 100f from the AC power sources 300a to 300c. Therefore, of adjacent targets 100a to 100f, when one is put in a positive potential, the other is put in a negative potential.

On the side of the electrode opposite to the targets 100a to 100f, a magnetic field forming means 200a to 200f are arranged. Each magnet field forming means 200a to 200f has a ring-like magnet of which the size is approximately similar to the outer circumference of the target 100a to 100f and a bar-like magnet having a length shorter than the ring-like magnet.

Each ring-like magnet is arranged in parallel relative to the longitudinal direction of the targets 100a to 100f at a position which is right behind the corresponding single target 100a to 100f. As mentioned above, since the targets 100a to 100f are arranged in parallel with a prescribed space being provided therebetween, the ring-like magnets are also arranged with the same interval being provided as in the case of the targets 100a to 100f.

It is preferred that the frequency of the AC sputtering be in the range of 10 kHz to 1 MHz. If the frequency is less than 10 kHz, a problem of noise may occur. If the frequency exceeds 1 MHz, since plasma spreads too widely, sputtering is conducted at a position other than the desired target position, whereby uniformity may be impaired. The frequency of the AC sputtering is more preferably 20 kHz to 500 kHz.

If the above-mentioned apparatus is used, the film-forming speed is preferably 70 to 250 nm/min, more preferably 100 to 200 nm/min.

In the method for producing an oxide thin film of the invention, it is preferred that the power density be 3 to 20 W/cm$^2$. If the power density is less than 3 W/cm$^2$, the film forming speed is slow, leading to economical disadvantage. If the power density exceeds 20 W/cm$^2$, the target may be broken. The power density is more preferably 5 to 12 W/cm$^2$.

EXAMPLES

Example 1

95.2 parts by weight of indium oxide powder having an average particle diameter of 0.5 μm and 4.8 parts by weight of gallium oxide powder having an average particle diameter of 0.5 μm (In:Ga(at %)=93:7) were placed in a polyethylene-made pot, and mixed by means of a dry ball mill for 72 hours to prepare powder mixture. Water, a dispersant and a binder were added to the mixture to allow it to be a slurry. The resulting slurry had a viscosity of 1000 cP.

The resulting slurry was placed in a beads mill accommodating zirconia-made beads each having a diameter of 3 mm, and was subjected to a 2-pass treatment. The treating time was 6 hours. This slurry was granulated by spray drying, whereby granulated powder was obtained.

The thus obtained granulated powder was put in a mold having a dimension of 250 mm (vertical), 400 mm (lateral) and 15 mm (thickness). The powder was shaped at a pressure of 200 kg/cm$^2$, and then subjected to a CIP (cold isostatic pressing) treatment at a pressure of 3 t/cm$^2$ (shaped body A). As for the shaped body A, the same 36 shaped bodies were produced.

Further, for the purpose of using in a thermo-mechanical analysis, a CIP shaped body (shaped body B) was produced under the same conditions as mentioned above after putting the above-obtained granulated powder in a mold of 60 mm (vertical), 60 mm (lateral) and 10 mm (thickness).

Figure 2:
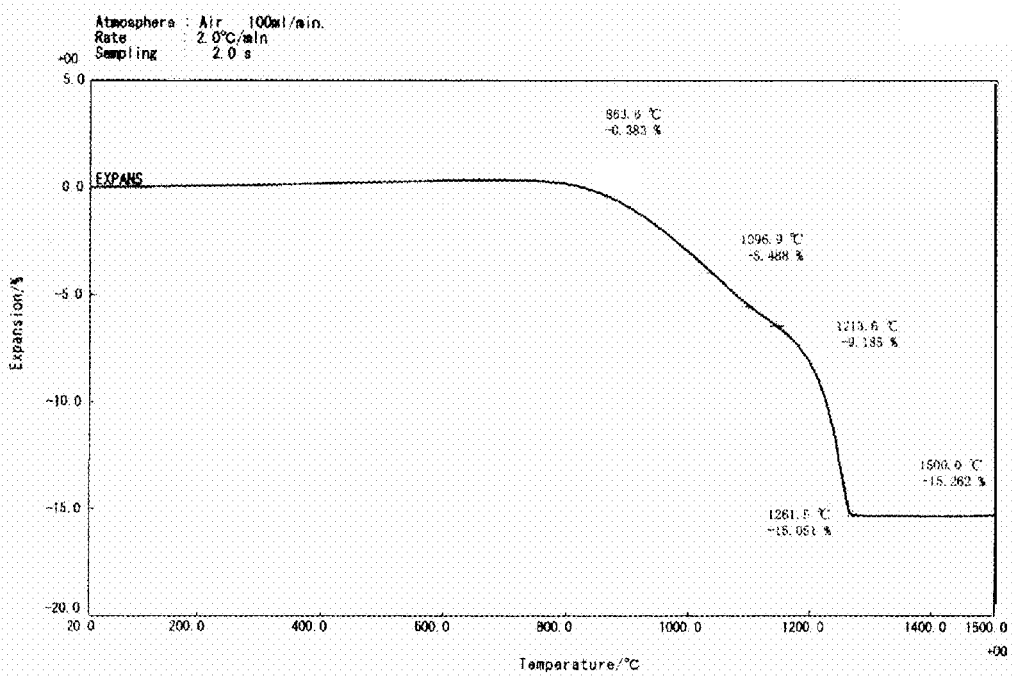
FIG. 2 is a view showing the dependency of the shaped body obtained in Example 1 on the heating temperature.

For one of the shaped bodies B, after conducting pre-firing at 400° C., it was processed into a size of 3 mm×3 mm×1.4 mm. The shaped body was then subjected to a thermo-mechanical analysis, and the dependency of the heat shrinkage on the heating temperature was measured. The results are shown in FIG. 2.

As a result, it was found that heat shrinkage started at 833° C. and the heat shrinkage speed became the fastest at around 1200° C.

Based on these results, the shaped body A and the shaped body B were placed in a sintering furnace in an oxygen atmosphere, and sintering was conducted according to the following conditions (sintered bodies A and B).

(1) First heating rate (400° C. or more and less than 700° C.) 0.5° C./min
(2) Second heating rate (700° C. or more and less than 1100° C.) 0.2° C./min
(3) Third heating rate (1100° C. or more and less than 1400° C.) 0.1° C./min
(4) Retaining at 1400° C. for 10 hours
(5) Furnace cooling Each of the 36 sintered bodies A was processed into a cuboid having a size of 200 mm (vertical)×280 mm (lateral)×10 mm (thickness). These 36 sintered bodies were bonded to a backing plate, 6 each, whereby a long sputtering target was prepared in a quantity of 6 (one obtained by dividing a target having a width of 200 mm, a length of 1700 mm and a thickness of 10 mm into 6).

Then, by using an AC sputtering apparatus shown in FIG. 1 disclosed in (JP-A-2005-290550), sputtering was conducted without heating a glass substrate having a width of 1100 mm, a length of 1250 mm and a thickness of 0.7 mm.

The above-obtained 6 long sputtering targets 100a to 100f were arranged in parallel with the width direction of the substrate such that the distance between the targets became 2 mm. The width of the magnet field forming means 200a to 200f was 200 mm as in the case of the targets 100a to 100f.

From the gas supply system, Ar and H$_2$O as sputtering gases were introduced at a flow rate of 99:1. The film-formation atmosphere at this time was 0.5 Pa. The power of the AC power source was 3 W/cm$^2$ (=10.2 kW/3400 cm$^2$) and the frequency was 10 kHz.

Film formation was conducted for 8 seconds under the above-mentioned conditions, and the thickness of the resulting IGO film was measured and found to be 15 nm. The surface of the film was as smooth as mirror. The surface was visually observed by using lamp reflection light, but no particles were observed.

From the sintered body B, 5 cuboids (3 mm×4 mm×40 mm) were cut. The 3-point bending test was conducted. As a result, the average bending strength was found to be 196 MPa.

Figure 3:
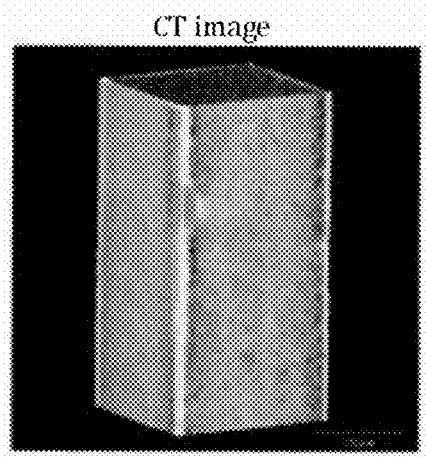
FIG. 3 is a view showing the results of an X-ray CT measurement of the sintered body obtained in Example 1.
Figure 3:
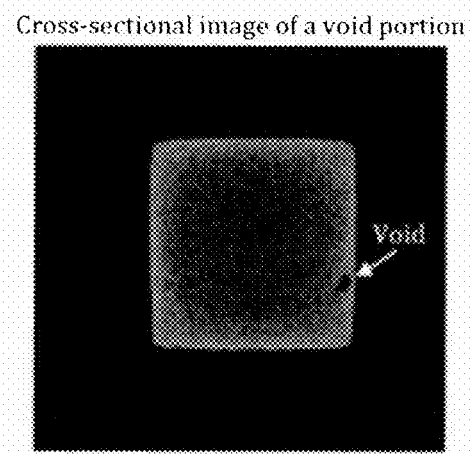
Figure 3:
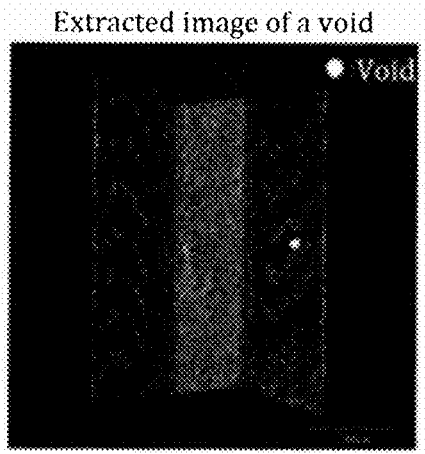

Further, from the sintered body B, a cuboid (1 mm×1 mm×5 mm) was cut, and the inside of the cuboid obtained was observed by an X-ray CT measurement machine manufactured by Yamato Scientific Co., Ltd. The results are shown in FIG. 3.

It was revealed that a void having a volume of 14000 μm$^3$ was present at one location, and the void ratio in the measurement range was 0.007%. The void was observed by visualizing three-dimensionally under the following conditions.
Measurement apparatus: TDM1000-IS (X-ray CT apparatus manufactured by Yamato Scientific Co., Ltd.)
Magnification: ×30
X-ray tube voltage: 100 kV
X-ray tube current: 0.022 mA Size of field of view: φ2 mm×h 2 mm
X-ray CT apparatus: TDM1000-IS (manufactured by Yamato Scientific Co., Ltd.)
X-ray tube voltage [KV]: 100.000
X-ray tube current [mA]: 0.022
Magnification: ×30
Size of field of view: φ2 mm×h 2 mm
Analysis software: TRI/3D-BON (manufactured by Ratoc System Engineering Co., Ltd.)

When clear voids each having a volume of 14000 μm³ were observed in this apparatus under these conditions, a value obtained by dividing the total of the volumes of these voids by the volume of the measurement region was defined as a void ratio.

As for the sintered bodies obtained in Examples 1 to 9, the crystal phase was examined by XRD. A bixbyite phase was observed in each sintered body.

Comparative Example 1

Sintered bodies C and D were obtained in the same manner as in Example 1, except that the heating step was changed as follows (Sintered bodies C and D (D: for thermo-mechanical analysis).

(1) First heating rate (400° C. or more and less than 700° C.) 0.5° C./min
(2) Second heating rate (700° C. or more and less than 1100° C.) 0.05° C./min
(3) Third heating rate (1100° C. or more and less than 1350° C.) 0.05° C./min.
(4) Retaining at 1350° C. for 15 hours
(5) Furnace cooling Each of the 36 sintered bodies C was processed into a cuboid having a size of 200 mm (vertical)×280 mm (lateral)×10 mm (thickness). These 36 sintered bodies were bonded to a backing plate, 6 each, whereby a long sputtering target (obtained by dividing a target having a width of 200 mm, a length of 1700 mm and a thickness of 10 mm into 6) was prepared in a quantity of 6.

Then, by using an AC sputtering apparatus shown in FIG. 1, sputtering was conducted without heating a glass substrate having a width of 1100 mm, a length of 1250 mm and a thickness of 0.7 mm in the same manner as in Example 1.

The thickness of the resulting IGO film was measured and found to be 15 nm. The surface of the film was as smooth as mirror. The surface was visually observed by using lamp reflection light, and a large number of particles were observed.

A broken piece obtained when processing and shaping the shaped body D was cut into 5 cuboids each having a size of 3 mm×4 mm×40 mm, and they were subjected to a 3-point bending test. As a result, it was found that the average bending strength was 95 MPa, which was half or less of the strength obtained in Example 1.

Figure 4:
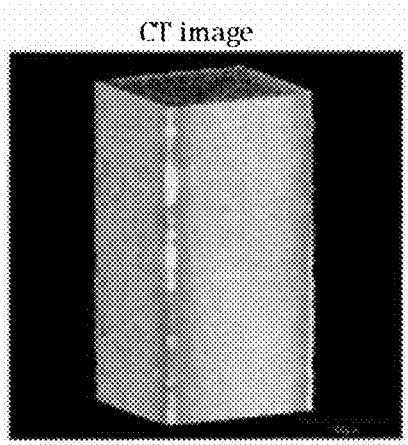
FIG. 4 is a view showing the results of an X-ray CT measurement of the sintered body obtained in Comparative Example 1.
Figure 4:
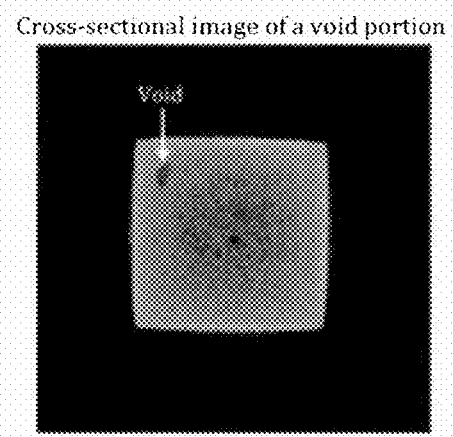
Figure 4:
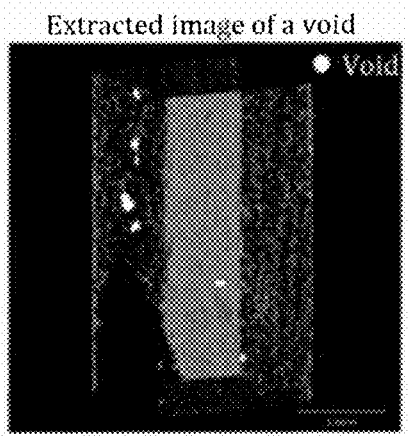

From the sintered body D, a cuboid (1 mm×1 m×5 mm) was cut. The inside was observed by the X-ray CT measurement machine mentioned above. The results are shown in FIG. 4.

It was revealed that a void having a volume of 14000 μm³ or more was present at 7 locations, and the void ratio in the measurement range was 0.05%. It was confirmed that a void having a volume of 14000 μm³ or more grew if the heating rate was too slow.

Examples 2 to 5 and Comparative Examples 2 and 3

Sintered bodies were prepared in the same manner as in Example 1, except that the composition, the heating conditions and the sintered body size were changed to those shown in Tables 1 and 2. Sputtering was then conducted, and the number of particles on the film, the average bending strength, and the amount and ratio of voids (measured by the X-ray CT measurement) were evaluated.

The size of the sputtering target and the size of the glass substrate were changed according to the size of the sintered body.

The results of Examples 2 to 5 are shown in Table 1, and the results of Comparative Examples 2 and 3 are shown in Table 2.

Example 6

Figure 5:
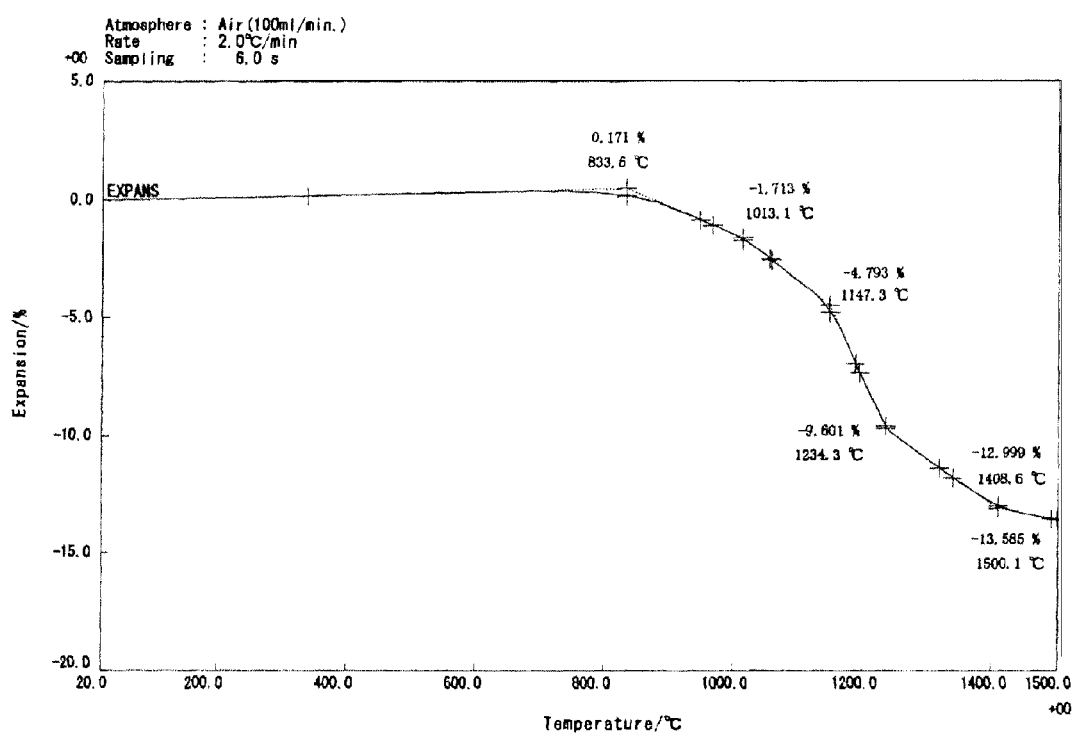
FIG. 5 is a view showing the dependency of the shaped body obtained in Example 7 on the heating temperature.

The slurry of the raw material powder mixture was put in the same mold as that used in Example 1 without conducting spray drying, and naturally dried. Since the resulting powder had a wide grain size distribution as compared with the granulated powder, the heat shrinkage occurred slowly. The results are shown in FIG. 5.

Next, sintering was conducted under the heating conditions as those shown in Table 1, and sputtering was conducted in the same manner as in Example 1. The number of particles on the film, the average bending strength, and the amount and ratio of voids (measured by the X-ray CT measurement) were evaluated.

Examples 7 and 8

The targets prepared in the same manner as in Example 6 were used for 10 hours (Example 7) and 50 hours (Example 8) in sputtering. Thereafter, sputtering was conducted. The number of particles on the resulting film was confirmed in the same manner as in Example 6. The results are shown in Table 1.

Example 9

Granulated powder was obtained in the same manner as in Example 1, except that 99.3 parts by weight of indium oxide powder having an average particle diameter of 0.5 μm and 0.7 parts by weight of gallium oxide powder having an average particle size of 0.5 μm were used.

Then, the mixture oxide powder was put in a mold, and preliminary shaping was conducted by means of a mold pressing machine at a pressure of 100 kg/cm². The shaped body was then consolidated at a pressure of 4 t/cm² by means of a cold isostatic pressing machine, whereby a columnar shaped body having a diameter of 340 mm and a height of 150 mm was obtained.

This shaped body was put in a sintering furnace, and sintered in the air as follows, thereby to obtain an oxide sintered body.

(1) First heating rate (400° C. or more and less than 700° C.) 1.0° C./min
(2) Second heating rate (700° C. or more and less than 1100° C.) 0.5° C./min
(3) Third heating rate (1100° C. or more and less than 1350° C.) 0.3° C./min
(4) Retaining at 1350° C. for 15 hours
(5) Furnace cooling The resulting oxide sintered body was put in a lathe, and then processed into a cylindrical body having an outer diameter of 300 mm, an inner diameter of 290 mm and a height of 100 mm. By fixing the cylindrical body to a backing plate by means of an In bonder, a target formed of the oxide sintered body was obtained. For a part of this cylindrical target, the inside was observed by means an X-ray CT measurement machine in the same manner as in Example 1. As a result, it was found that the number of voids each having a volume of 14000 μm³ or more was one and the void ratio was 0.006%. The bending strength was 209 MPa.

Subsequently, sputtering was conducted by using this cylindrical IGO target, and the number of particles of the resulting IGO film was measured. Two particles were confirmed.

Comparative Examples 4 and 5

The targets obtained in the same manner as in Comparative Example 3 were used for 10 hours (Comparative Example 4) and 50 hours (Comparative Example 5) for sputtering. Thereafter, sputtering was conducted. The number of particles on the resulting film was confirmed in the same manner as in Comparative Example 3. The results are shown in Table 2.

TABLE 1

|  | Example 1 | Example 2 | Example 3 | Example 4 | Example 5 |
|---|---|---|---|---|---|
| Composition | $In_2O_3:Ga_2O_3$ | $In_2O_3:Ga_2O_3$ | $In_2O_3:Ga_2O_3$ | $In_2O_3:Ga_2O_3:SnO_2$ | $In_2O_3:Ga_2O_3:Al_2O_3$ |
| In:Ga (at %) | 93:7 | 92.8:7.2 | 91:9 | In:Ga:Sn = 92.8:7.1:0.1 | In:Ga:Al = 93.0:6.9:0.1 |
| Sintered body size (mm) | 200 × 280 × 10 | 250 × 2000 × 10 | 500 × 500 × 12 | 200 × 280 × 10 | 200 × 280 × 10 |
| Area (mm²) | 56000 | 500000 | 250000 | 56000 | 56000 |
| First heating rate (° C./min) (400° C. or higher and lower than 700° C.) | 0.50 | 0.20 | 1.50 | 1.00 | 1.00 |
| Second heating rate (° C./min) (700° C. or higher and lower than 1100° C.) | 0.2 | 0.2 | 0.8 | 0.5 | 0.5 |
| Third heating rate (° C./min) (1100° C. or higher and 1400° C. or lower) | 0.1 | 0.1 | 0.5 | 0.3 | 0.3 |
| Highest temperature (° C.) | 1400 | 1400 | 1300 | 1400 | 1400 |
| Highest temperature retention time (hr) | 10 | 20 | 10 | 15 | 20 |
| Number of voids having a volume of 14,000 μm³ or more | 1 | 2 | 1 | 1 | 3 |
| Void ratio (%) of voids having a volume of 14,000 μm³ or more | 0.007 | 0.009 | 0.005 | 0.005 | 0.011 |
| Bending strength (MPa) | 196 | 212 | 188 | 250 | 230 |
| Number of particles on the sputtering film | 0 | 1 | 1 | 1 | 0 |

|  | Example 6 | Example 7 | Example 8 | Example 9 |
|---|---|---|---|---|
| Composition | $In_2O_3:Ga_2O_3$ | $In_2O_3:Ga_2O_3$ | $In_2O_3:Ga_2O_3$ | $In_2O_3:Ga_2O_3$ |
| In:Ga (at %) | 95:5 | 95:5 | 95:5 | 99:1 |
| Sintered body size (mm) | 200 × 280 × 10 | 200 × 280 × 10 | 200 × 280 × 10 | 300φ × 100 × 5 |
| Area (mm²) | 56000 | 56000 | 56000 | 70650 |
| First heating rate (° C./min) (400° C. or higher and lower than 700° C.) | 1.00 | 1.00 | 1.00 | 1.00 |
| Second heating rate (° C./min) (700° C. or higher and lower than 1100° C.) | 0.5 | 0.5 | 0.5 | 0.5 |
| Third heating rate (° C./min) (1100° C. or higher and 1400° C. or lower) | 0.3 | 0.3 | 0.3 | 0.3 |
| Highest temperature (° C.) | 1400 | 1400 | 1400 | 1350 |
| Highest temperature retention time (hr) | 10 | 10 | 10 | 15 |
| Number of voids having a volume of 14,000 μm³ or more | 2 | 2 | 2 | 1 |
| Void ratio (%) of voids having a volume of 14,000 μm³ or more | 0.009 | 0.009 | 0.009 | 0.006 |
| Bending strength (MPa) | 190 | 190 | 190 | 209 |
| Number of particles on the sputtering film | 2 | 2 (after using the target for 10 hours) | 3 (after using the target for 50 hours) | 2 |

TABLE 2

|  | Com. Ex. 1 | Com. Ex. 2 | Com. Ex. 3 | Com. Ex. 4 | Com. Ex. 5 |
|---|---|---|---|---|---|
| Composition | $In_2O_3:Ga_2O_3$ | $In_2O_3:Ga_2O_3$ | $In_2O_3:Ga_2O_3$ | $In_2O_3:Ga_2O_3$ | $In_2O_3:Ga_2O_3$ |
| In:Ga (at %) | 93:7 | 85:15 | 93:7 | 93:7 | 93:7 |
| Sintered body size (mm) | 200 × 280 × 10 | 200 × 280 × 10 | 250 × 2000 × 10 | 250 × 2000 × 10 | 250 × 2000 × 10 |
| Area (mm²) | 56000 | 56000 | 500000 | 500000 | 500000 |
| First heating rate (° C./min) | 0.50 | 0.20 | 0.50 | 0.50 | 0.50 |
| Second and third heating rates (° C./min) | 0.05 | 1.0 | 0.8 | 0.8 | 0.8 |
| Maximum temperature (° C.) | 1400 | 1350 | 1400 | 1400 | 1400 |

TABLE 2-continued

|  | Com. Ex. 1 | Com. Ex. 2 | Com. Ex. 3 | Com. Ex. 4 | Com. Ex. 5 |
|---|---|---|---|---|---|
| Highest temperature retention time (hour) | 15 | 15 | 50 | 50 | 50 |
| Number of voids having a volume of 14,000 μm³ or more | 7 | 10 | 11 | 11 | 11 |
| Void ratio (%) of voids having a volume of 14,000 μm³ or more | 0.05 | 0.09 | 0.08 | 0.08 | 0.08 |
| Bending strength (MPa) | 95 | 30 | 50 | 50 | 50 |
| Number of particles on the sputtering film | 5 | 11 | 50 | 60 (after using the target for 10 hours) | 90 (after using the target for 50 hours) |

INDUSTRIAL APPLICABILITY

By using the sintered body (target) of the invention, a semiconductor for a display device represented by a large-sized liquid crystal display or a large-sized EL display or a transparent electrode material for a large-area solar battery can be obtained efficiently with a high yield.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. A sputtering target which consists essentially of an oxide of indium and gallium or an oxide of indium, gallium and tin and/or aluminum and comprises voids each having a volume of 14000 μm³ or more in an amount of 0.03 vol % or less of the volume of the sputtering target.

2. The sputtering target according to claim 1, wherein one surface of the sintered body has an area of 25000 mm² or more and a thickness of 5 mm or more.

3. The sputtering target according to claim 1, which has an atomic ratio represented by Ga/(In+Ga) of 0.01 to 0.13 and comprises a bixbyite structure represented by $In_2O_3$.

4. The sputtering target according to claim 1, which comprises tin in an amount of 100 to 10000 ppm.

5. The sputtering target according to claim 1, which comprises Al in an amount of 100 to 10000 ppm.

6. A method for producing an oxide thin film, wherein a film is formed using the sputtering target according to claim 1 by a sputtering method at a sputtering power of 3 to 20 W/cm².

* * * * *